United States Patent
Harriman et al.

(10) Patent No.: US 10,750,617 B2
(45) Date of Patent: Aug. 18, 2020

(54) BOND-FREE INTERCONNECT BETWEEN A MICROCIRCUIT HOUSING AND A PRINTED CIRCUIT ASSEMBLY

(71) Applicant: Keysight Technologies, Inc., Santa Rosa, CA (US)

(72) Inventors: Michael John Harriman, Santa Rosa, CA (US); Ryan Michael Avella, Santa Rosa, CA (US); Leonard M. Weber, Bodega Bay, CA (US); Brian R. Hutchison, Windsor, CA (US); Naveed Edalati, Santa Rosa, CA (US); David Massie, Santa Rosa, CA (US); Rodrik Jon Lund, Santa Rosa, CA (US); Connie Van Schaick, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/547,108

(22) Filed: Aug. 21, 2019

(65) Prior Publication Data
US 2020/0214139 A1 Jul. 2, 2020

Related U.S. Application Data

(60) Provisional application No. 62/787,054, filed on Dec. 31, 2018.

(51) Int. Cl.
*G01R 31/28* (2006.01)
*H05K 3/10* (2006.01)
*H05K 5/00* (2006.01)
*H05K 7/20* (2006.01)

(52) U.S. Cl.
CPC ........... *H05K 3/103* (2013.01); *H05K 5/0008* (2013.01); *H05K 7/20454* (2013.01)

(58) Field of Classification Search
CPC .. G01R 3/00; G01R 1/06738; G01R 1/07314; G01R 1/06733; G01R 31/2889; G01R 31/31905; G01R 1/06705; G01R 1/07357; G01R 31/2887; G01R 1/07342; H01R 12/52; H01R 12/7076; H01R 12/57
See application file for complete search history.

(56) References Cited

U.S. PATENT DOCUMENTS

| | | | |
|---|---|---|---|
| 4,885,662 A | 12/1989 | Bartholomew et al. | |
| 4,988,306 A | 1/1991 | Hopfer, III et al. | |
| 2007/0007977 A1* | 1/2007 | Eldridge | G01R 31/2889 324/756.03 |

(Continued)

*Primary Examiner* — Steven T Sawyer

(57) ABSTRACT

A method of assembling a fully detachable microcircuit starts with obtaining a fabricated microcircuit housing with an upper surface, a lower surface, a first recess in the upper surface, a second recess in the lower surface, and a pin on the lower surface. A thermal layer is applied to the lower surface. A conductive elastomer signal pin connector and a ground pin connector are attached to a thin film circuit, and the thin film circuit with is inserted into the second recess with the conductive elastomer signal pin connector and the ground pin connector attached. A bonding target is applied to the upper surface. The bonding target and the microcircuit are connected with a bond wire. The microcircuit housing is screwed to a printed circuit assembly without bonding the microcircuit housing to the printed circuit assembly.

17 Claims, 11 Drawing Sheets

(56) References Cited

U.S. PATENT DOCUMENTS

| | | | |
|---|---|---|---|
| 2010/0026331 A1* | 2/2010 | Chong | G01R 1/07342 |
| | | | 324/754.03 |
| 2010/0066393 A1* | 3/2010 | Bottoms | G01R 1/06711 |
| | | | 324/755.05 |
| 2013/0093453 A1* | 4/2013 | Sakata | G01R 31/2887 |
| | | | 324/756.03 |
| 2014/0340103 A1* | 11/2014 | Kasai | G01R 31/2887 |
| | | | 324/750.16 |
| 2019/0088560 A1* | 3/2019 | Newby | G02B 6/12004 |

\* cited by examiner

BOND-FREE INTERCONNECT BETWEEN A MICROCIRCUIT HOUSING AND A PRINTED CIRCUIT ASSEMBLY

CROSS REFERENCE TO RELATED APPLICATIONS

The present application claims priority under 35 U.S.C. § 119(e) to U.S. Provisional Application No. 62/787,054, filed on Dec. 31, 2018, and naming Michael John Harriman, et al. as inventors. The entire disclosure of U.S. Provisional Application No. 62/787,054 is hereby specifically incorporated by reference in its entirety.

BACKGROUND

Microcircuits are small electronic circuits and include integrated circuits in which connected components are installed in/on a chip of semiconducting material. For testing purposes, a microcircuit may be housed in/on a microcircuit housing assembly to, for example, avoid directly connecting the microcircuit content to a printed circuit assembly to which the microcircuit housing assembly is instead directly attached.

Currently, an entity that tests microcircuits may require a full printed circuit assembly (PCA) to arrive from a contract manufacturer (CM). A printed circuit assembly is a printed circuit board (PCB) on which components are installed. In the context of testing a microcircuit housed in a microcircuit housing assembly, the components installed on the printed circuit board may include the microcircuit housing assembly. For testing, surface mounting technology (SMT) modifications are performed on the printed circuit assembly, and then microcircuit content is assembled in/on the microcircuit housing(s) to result in a completed assembly. The completed assembly with the printed circuit board, the microcircuit housing assembly, any other components on the printed circuit board, and the microcircuit content in/on the microcircuit housing may be used in a test environment to test the microcircuit content.

An entity that uses the completed assembly with the microcircuit housing assembly may have different steps and stages performed by different departments, such as an SMT department for the SMT modifications and a precision microelectronics assembly department for assembly of the microcircuit content. In the assembly process, shims may be added to the printed circuit assembly via pads and the microcircuit housing may be epoxied onto the printed circuit assembly. Bond wires may then be connected to the shim on the printed circuit assembly and the microcircuit content in/on the microcircuit housing. Tests can then be performed on the microcircuit content.

Initial direct current (DC) tests can be performed by the contract manufacturer and the precision microelectronics assembly department without the microcircuit content, but some testing cannot be performed without the microcircuit content. For example, amplifier loop biasing testing cannot be tested without the microcircuit content.

Rework of the microcircuit in/on the microcircuit housing is time consuming and if the completed assembly is damaged the entire completed assembly can be ruined. The printed circuit assemblies on which the microcircuit housings are installed may sometimes be expensive pieces of equipment, such as when the printed circuit assemblies are customized for testing of high frequency circuitry. Additionally, troubleshooting of a problem detected in the microcircuit testing can be complicated when the microcircuit housings are inextricable from the printed circuit assemblies.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
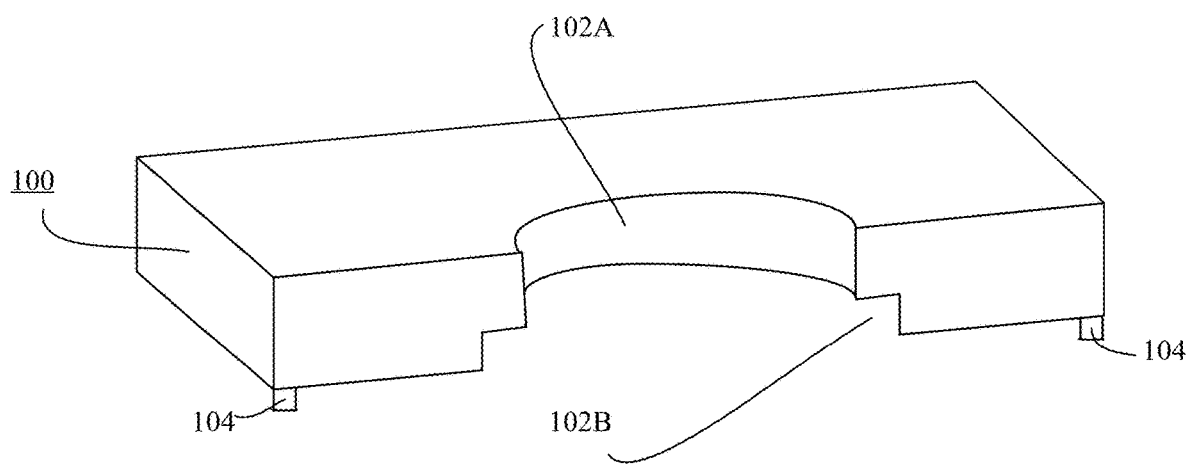
FIG. 1A illustrates a sectional view of an attachable and detachable microcircuit housing, in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting.

The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only, and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

As described below, a fully detachable microcircuit housing can be attached to a printed circuit assembly using mechanical fasteners without requiring additional bonding. This allows the microcircuit housing and microcircuit to be assembled prior to the arrival of the printed circuit assembly. A known operationally satisfactory printed circuit assembly can be used to test all functionality of the microcircuit before additional printed circuit assemblies arrive. This allows a microcircuit fabricator to build and assemble at their leisure, removing the permanent or semi-permanent tie between the microcircuit housing and printed circuit assembly that results from bonding. Additionally, a verified and known operationally satisfactory microcircuit housing can be sent to a contract manufacturer to temporarily attach to their printed circuit assemblies for preliminary testing to verify that the printed circuit assemblies are built and assembled correctly before being shipped to the entity that performs the comprehensive testing. A fully detachable microcircuit housing can be removed when it needs repair work done and in the case of being damaged a printed circuit assembly will not need to be discarded. Similarly, if a printed circuit assembly is damaged, the microcircuit housing need not be discarded.

FIG. 1A illustrates a sectional view of an attachable and detachable microcircuit housing, in accordance with a representative embodiment.

In FIG. 1A, the microcircuit housing 100 has an upper surface and a lower surface opposite the upper surface. The microcircuit housing 100 may be just the floor of a housing, as distinguishable from walls and a ceiling/lid, insofar as the microcircuit housing 100 may be directly mated with a printed circuit assembly 180 as described herein. The microcircuit housing 100 includes a first recess 102A, a second recess 102B, and stoppers 104. The microcircuit housing 100 in FIG. 1A may be only a small portion of a much larger testing housing 100 as shown in later embodiments. The microcircuit housing 100 may include high performance instrumentation that would not be suitable for attachment directly to a printed circuit assembly. In embodiments shown herein, the microcircuit housing 100 may be attached to a printed circuit assembly 180 that also includes circuitry directly installed thereon.

The microcircuit housing 100 sits on a printed circuit assembly 180 and may be used to connect high-frequency and/or high-precision electrical components to the printed circuit assembly 180 indirectly. As explained herein, bond wires 114 may be used to indirectly connect such electrical components to a printed circuit assembly 180 via a thin film circuit interface 112, a thin film circuit via pad 113 or optional shim, and a conductive elastomer pin 120 that includes signal and ground pins.

The first recess 102A and the second recess 102B provide a transition or via through the microcircuit housing 100. The first recess 102A and the second recess 102B may both be considered openings as described herein. The microcircuit housing 100 may include numerous transitions or vias that each include the first recess 102A and the second recess 102B. The first recess 102A and the second recess 102B may be formed by drilling through the microcircuit housing. The first recess 102A may be adjacent to the second recess 102B and the first recess 102A and the second recess 102B may be considered a single recess even when they have differing dimensions. The first recess 102A has a first center and a maximum diameter that is the largest of any cross-sectional diameter of the first recess 102A. The second recess 102B has a second center and a maximum diameter that is the largest of any cross-sectional diameter of the second recess 102B. The maximum diameter of the first recess 102A is less than the maximum diameter of the second recess 102B. The differences in diameters allows the thin film circuit interface 112 to form a lower surface for the first recess 102A when the thin film circuit interface 112 is inserted into the second recess 102B.

Additionally, the first recess 102A and the second recess 102B in FIG. 1A have the appearance of being circles. However, recesses may be non-circular ellipses each with two separated foci, so long as the largest cross-sectional dimension of the first recess 102A is less than the largest cross-sectional dimension of the second recess 102B. In other embodiments, the first recess 102A and the second recess 102B may alternatively be triangles, rectangles, pentagons, or other shapes, so long as the largest cross-sectional dimension of the first recess 102A is less than the largest cross-sectional dimension of the second recess 102B. Additionally, the first recess 102A and the second recess 102B may have shapes different from one another, and one (e.g., the first recess 102A) or both may have an irregular shape. The first recess 102A may be created after the second recess 102B or before the second recess 102B, or the first recess 102A and the second recess 102B may be created simultaneously. So long as a structure such as a thin film circuit interface 112 (described below) can be passed through the second recess 102B to rest against the first recess 102A, this aspect of the functionality of these recesses in the microcircuit housing 100 may be met.

The microcircuit housing 100 may be integrally formed, such as from a molded brick that is drilled, etched, and otherwise subjected to modifications to result in the features of the microcircuit housing 100 described herein. The microcircuit housing 100 shown in FIG. 1A may be representative of a much larger structure dedicated to serving as an integral microcircuit housing. The larger structure serving as a microcircuit housing and including the microcircuit housing 100 in FIG. 1A may have multiple first recesses, second recesses and stoppers identical to or similar to the first recess 102A, the second recess 102B and the stoppers 104 shown in FIG. 1A. In other words, the microcircuit housing 100 may represent a simplified view of a customized integral structure used for high performance instrumentation.

The stoppers 104 shown in FIG. 1A are representative of stoppers that firmly stop the attachment of a printed circuit assembly 180 to the microcircuit housing 100. The printed circuit assembly 180 may be attached to the microcircuit housing 100 such as by screws, and the bottom of the stoppers 104 may represent closest contact of the microcircuit housing 100 to the printed circuit assembly 180. Although FIG. 1A and other FIGs. herein show two of the stoppers 104, the stoppers 104 are not limited to two and the microcircuit housing 100 may include more than two stoppers 104. Although the stoppers 104 in FIG. 1A appear as separate items from the microcircuit housing 100 in FIG. 1A, the stoppers 104 may be integrally formed from the same underlying brick of material as the microcircuit housing 100, or the stoppers 104 may be attached to the microcircuit housing 100 from separate pieces such as by welding, soldering or gluing.

The microcircuit housing 100 in FIG. 1A may be customized for specific applications. For example, an engineer tasked with testing electronic equipment may customize the microcircuit housing 100 for specific types of testing such as for high frequency applications. In use, the microcircuit housing 100 is attachable and detachable from a printed circuit assembly 180. As the term is used herein, a printed circuit assembly 180 may be a printed circuit board that attaches directly to the microcircuit housing 100 and other electronic components. The microcircuit housing 100 may be configured into an assembled microcircuit before being connected to a printed circuit assembly 180, and a microcircuit may be installed onto the microcircuit housing 100 without directly contacting the printed circuit assembly 180.

Figure 1B:
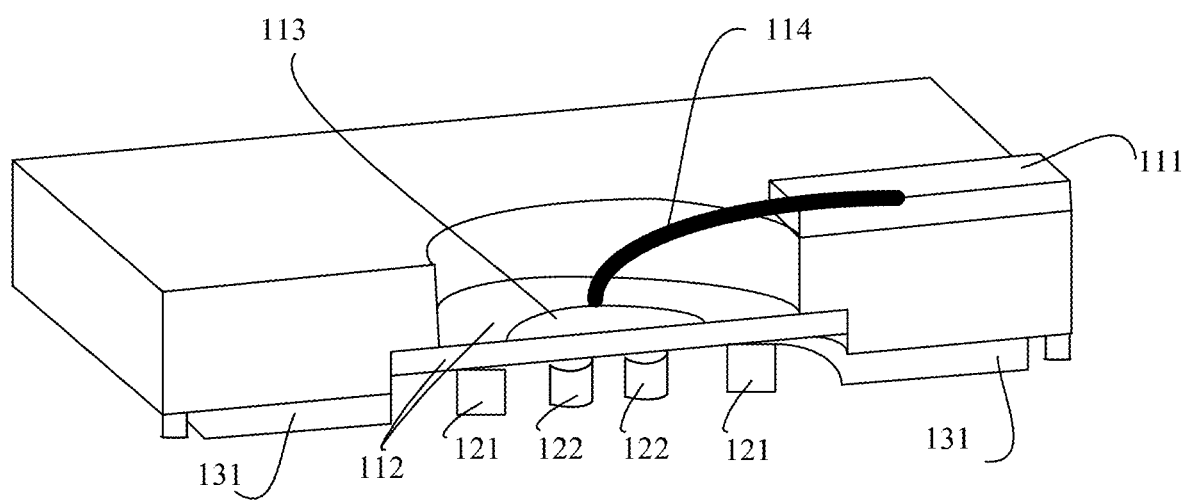
FIG. 1B illustrates an attachable and detachable assembled microcircuit for testing a microcircuit using the microcircuit housing in FIG. 1A, in accordance with a representative embodiment.

FIG. 1B illustrates an attachable and detachable assembled microcircuit for testing a microcircuit using the microcircuit housing in FIG. 1A, in accordance with a representative embodiment.

In FIG. 1B, the microcircuit housing 100 in FIG. 1A is modified to include a bonding target 111 applied on an upper surface, a thin film circuit interface 112 applied in the second recess 102B, and a thermal layer 131 applied on a lower surface. A thin film circuit interface 112 is a solid planar substrate that is or may be hundreds of micrometers thick, with thin conductive layers a few microns thick on either side. The conductive layers on either side can be electrically connected through plated conductive slots which penetrate through the substrate. These plated conductive slots are otherwise known as "vias". A via pad 113 is applied on and through the thin film circuit interface 112, and signal pin connectors 122 and ground pin connectors 121 are attached to a lower surface of the thin film circuit interface 112.

The bonding target 111 may be a microcircuit such as a thin film microcircuit or other integrated circuit. The bonding target 111 may alternatively be a capacitor or other individual electronic circuit component. As described herein, the bonding target 111 may be uniquely formed on/in the microcircuit housing 100 from individual components as microcircuit content, or may be formed separately and then installed, attached to or otherwise applied to the microcircuit housing 100 as a single unit.

In embodiments, a shim may be optionally bonded to the top of the via pad 113.

Additionally, in embodiments the signal pin connectors 122 and ground pin connectors 121 may be elements of an integral compressible conductive elastomer pin. For example, the signal pin connectors 122 and ground pin connectors 121 may be elements of an Invisipin®, from RDIS of Allentown, Pa. The integral conductive elastomer pin with the signal pin connectors 122 and ground pin connectors 121 may be a conductive elastomer pin that is epoxied to the thin film circuit interface 112 with signal and ground vias. The signal pin connectors 122 and ground pin connectors 121 may also be switchable, so as to be removable from the microcircuit housing 100. Elastomer is a natural or synthetic polymer with elastic properties. An example of elastomer is rubber. The thin film circuit interface 112 is then placed and epoxied into the second recess 102B on the bottom of the microcircuit housing 100. The opposite side of the thin film circuit interface 112 has the via pad 113 and optionally a shim, to provide bonds to the devices inside the microcircuit of the bonding target 111.

The signal pin connectors 122 and ground pin connectors 121 may be attached to the thin film circuit interface 112 (such as by epoxying) before the thin film interface is inserted into the second recess 102B and attached to the microcircuit housing 100 (such as by epoxying). Alternatively, the signal pin connectors 122 and ground pin connectors 121 may be attached to the thin film circuit interface 112 after the thin film circuit interface 112 is inserted into the second recess 102B and attached to the microcircuit housing 100.

The microcircuit housing 100 with the modifications shown in FIG. 1B is then placed onto a printed circuit assembly 180 (see FIG. 1D) using the compressible pin with the signal pin connectors 122 and ground pin connectors 121 to make electrical contact to signal and ground pads and vias on the printed circuit assembly 180.

The thermal layer 131 may be a thin layer of conductive silicone rubber placed between the bottom of the microcircuit housing 100 and the printed circuit assembly 180 for thermal and electrical contact. Alternatively, the thermal layer 131 may be a thermal paste used to create a thermal contact between the microcircuit housing 100 and the printed circuit assembly 180. The thermal layer 131 in embodiments herein replaces functionality of the bonding material previously used to bond a printed circuit assembly to a microcircuit housing. That is, the thermal layer 131 may collect and dissipate heat generated by the microcircuit housing 100 and the printed circuit assembly 180, which is a function previously served by the bonding material which is not used to bond the microcircuit housing 100 and the printed circuit assembly 180 in embodiments herein. When the thermal layer 131 is a structural layer rather than a paste, the thermal layer 131 may be attached to the microcircuit housing 100 by epoxy. However, the attachment mechanism for a thermal layer 131 that is a structure such as a pad does not have to be epoxy or a form of adhesion. Additionally, even when the thermal layer 131 is attached with an adhesive, the adhesiveness of the adhesive may vary so as to allow the thermal layer 131 to be removed in appropriate circumstances without damaging the thermal layer 131 or the microcircuit housing 100.

The microcircuit housing 100 is secured using screws on the opposite side of the printed circuit assembly 180 that attach both the microcircuit housing 100 and a lid (shown in later embodiments) which pulls everything together giving a secure mechanical fit with appropriate thermal and electrical conductivity. As described herein when the microcircuit housing 100 is connected to the printed circuit assembly 180 with fasteners, whether screws or another form of mechanical fastener, the thermal layer 131 is protected from being compressed or overly-compressed by the stopper 104. In an embodiment, the thermal layer 131 may be a gasket. A gasket is a shaped piece or ring of material to seal the junction between two surfaces such as the lower surface of the microcircuit housing 100 and the printed circuit assembly 180.

Figure 1C:
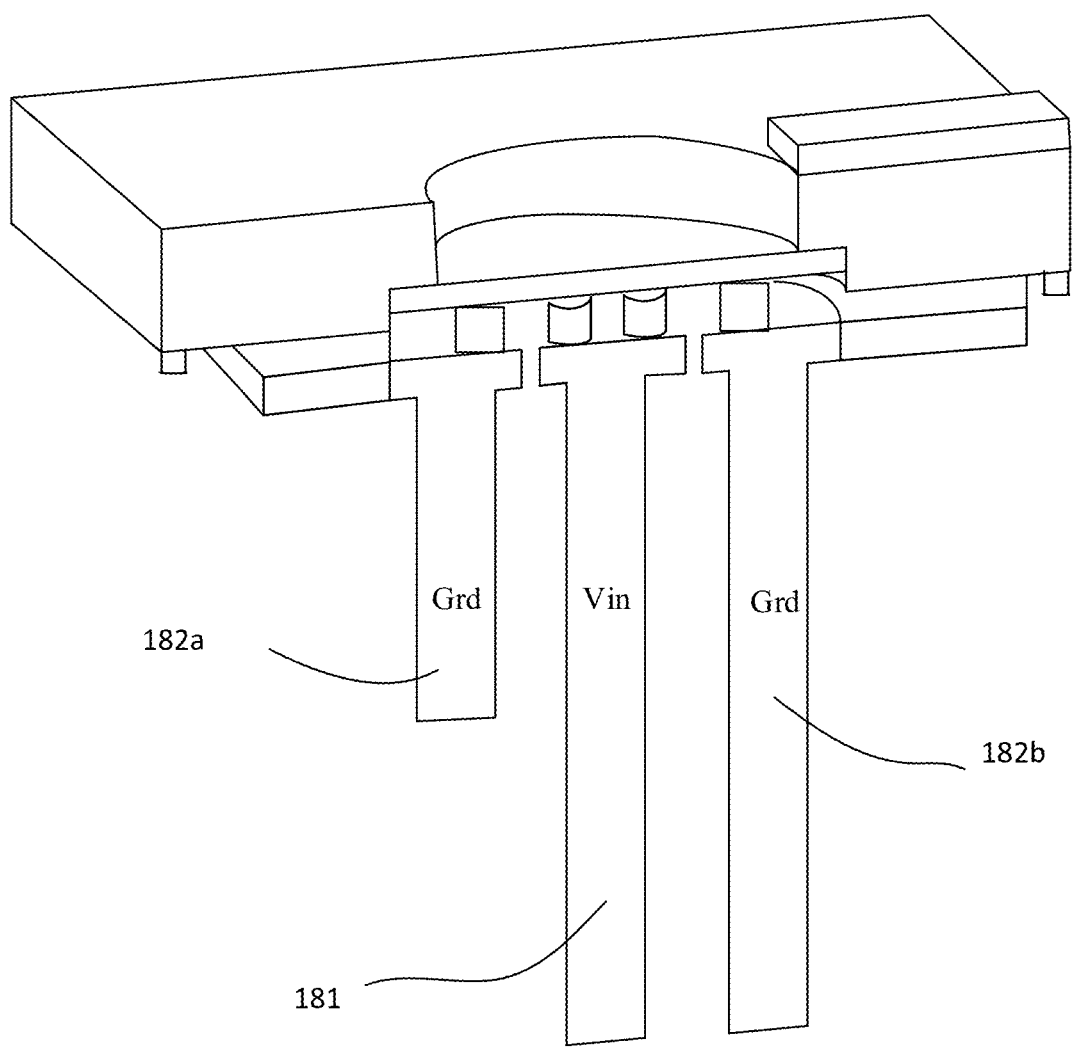
FIG. 1C illustrates a completed assembly for testing a microcircuit including a portion of a printed circuit assembly and the assembled microcircuit in FIG. 1B, in accordance with a representative embodiment.

FIG. 1C illustrates a completed assembly for testing a microcircuit including a portion of a printed circuit assembly and the assembled microcircuit in FIG. 1B, in accordance with a representative embodiment.

In FIG. 1C, the microcircuit housing 100 from FIG. 1A as modified with the modifications in 1B is attached to a printed circuit assembly 180. In FIG. 1C, only the signal input 181 (Vin) and the ground lines 182a and 182b are shown as representative elements of the printed circuit assembly 180. The signal input 181 is connected to the signal pin connectors 122, and the ground lines 182a and 182b are connected to the ground pin connectors 121.

As explained later, the printed circuit assembly 180 with the signal input 181 and the ground lines 182a and 182b is attached to the microcircuit housing 100, such as by screwing the microcircuit housing 100 to the printed circuit assembly 180 without bonding the microcircuit housing 100 to the printed circuit assembly 180. When the printed circuit assembly 180 is attached to the microcircuit housing 100, the thermal layer 131 may be compressed due to the attaching. The stoppers 104 stop the attachment of the microcircuit housing 100 to the printed circuit assembly 180 to reduce the compression of the thermal layer 131. The stoppers 104 may fully or partially stop the attachment and may be sized specifically to stop the attachment to ensure that the thermal layer 131 is not compressed due to the attachment beyond the point where the stoppers 104 contact the printed circuit assembly 180.

Figure 1D:
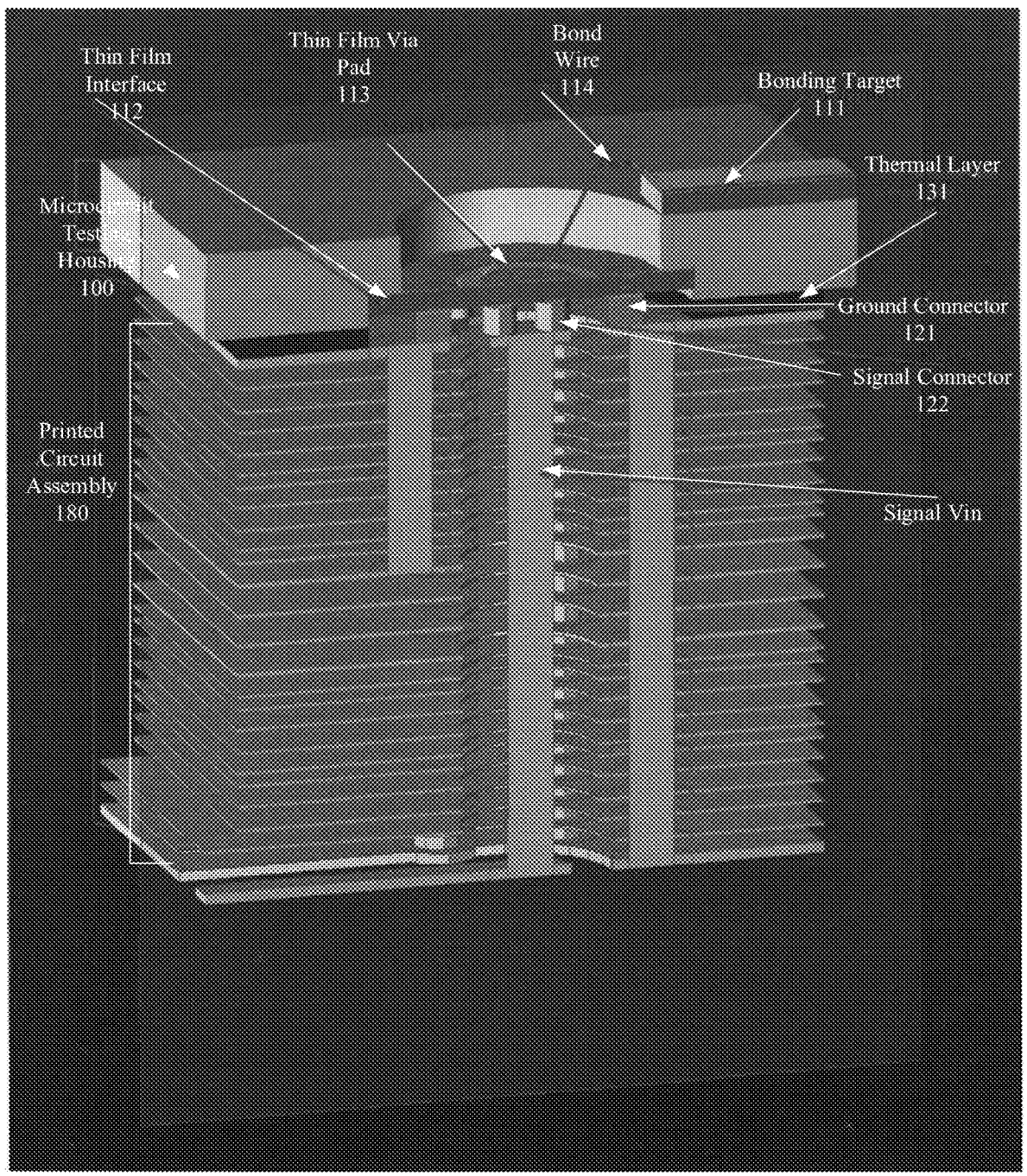
FIG. 1D illustrates another completed assembly for testing a microcircuit including an interconnected printed circuit assembly and the assembled microcircuit in FIG. 1B, in accordance with a representative embodiment.

FIG. 1D illustrates another completed assembly for testing a microcircuit including an interconnected printed circuit assembly and the assembled microcircuit in FIG. 1B, in accordance with a representative embodiment.

In FIG. 1D, the completed assembly includes the printed circuit assembly 180 and the microcircuit housing 100 modified as shown in FIG. 1B. The microcircuit housing 100 in FIG. 1D does not show the stoppers 104, but the stoppers 104 shown in other figures may be included in the microcircuit housing 100 in areas now shown in order to ensure that the thermal layer 131 is not overly compressed. The level of compression may greatly affect thermal and electrical properties of the thermal layer 131, such as conductivity. The thermal layer 131 provides, for example, an ability to remove heat from the microcircuit housing 100. The stoppers 104 may be bumps on the lower surface of the microcircuit housing 100, to ensure that compression is limited to a tolerable level.

The thermal layer 131 may be or include a conductive silicone rubber or thermal paste. The ground pin connectors 121 and signal pin connectors 122 are provided on a lower surface of a thin film circuit interface 112, and a bond wire 114 connects a thin film circuit via pad 113 on the thin film circuit interface 112 to a bonding target 111. A shim may be optionally bonded to the top of the thin film circuit via pad 113. The bonding target 111 may be a thin film microcircuit or a capacitor, for example.

Figure 6:
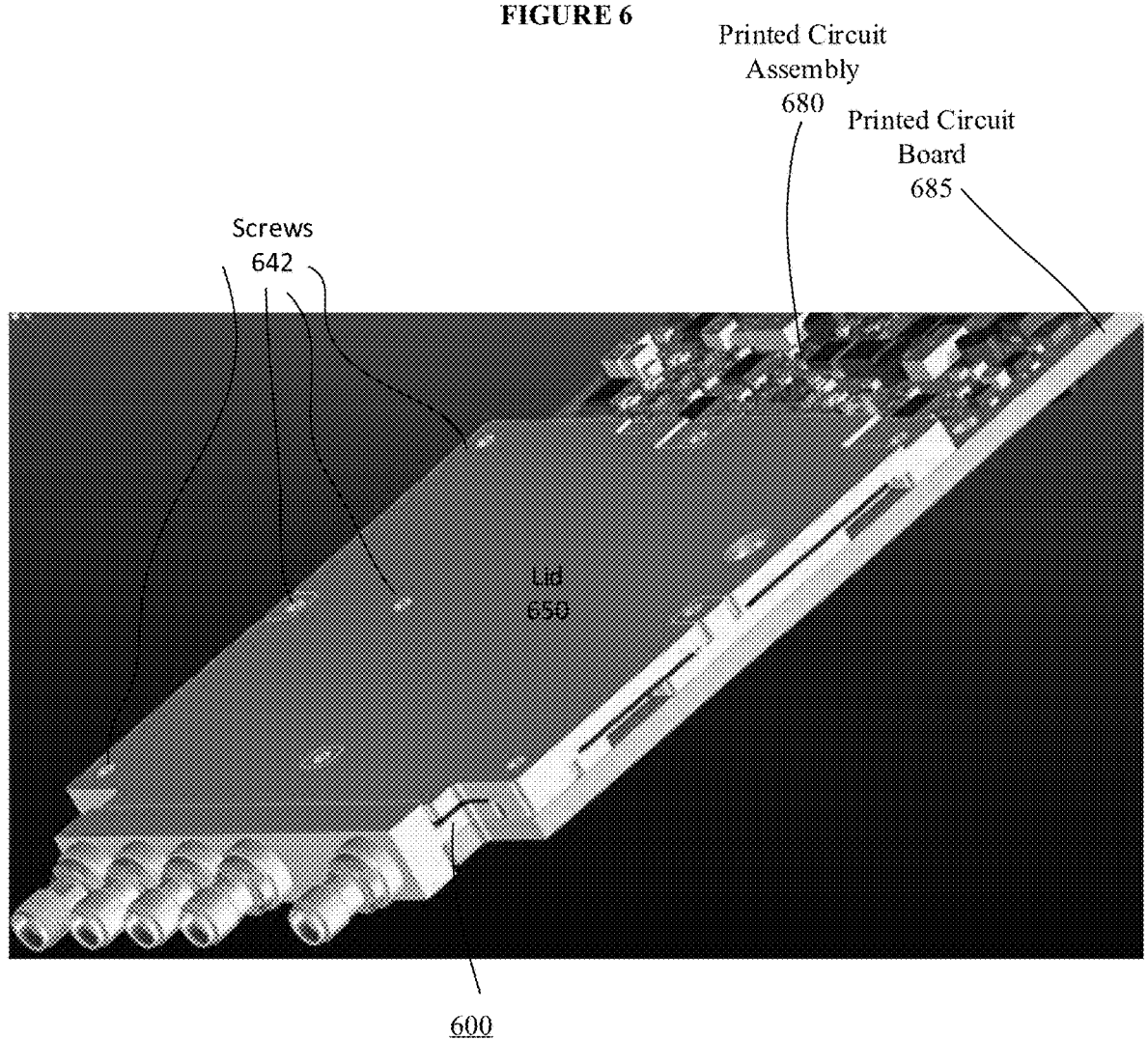
FIG. 6 illustrates a completed assembly for testing a microcircuit including a printed circuit assembly, a microcircuit housing, and a lid, in accordance with a representative embodiment.
Figure 7:
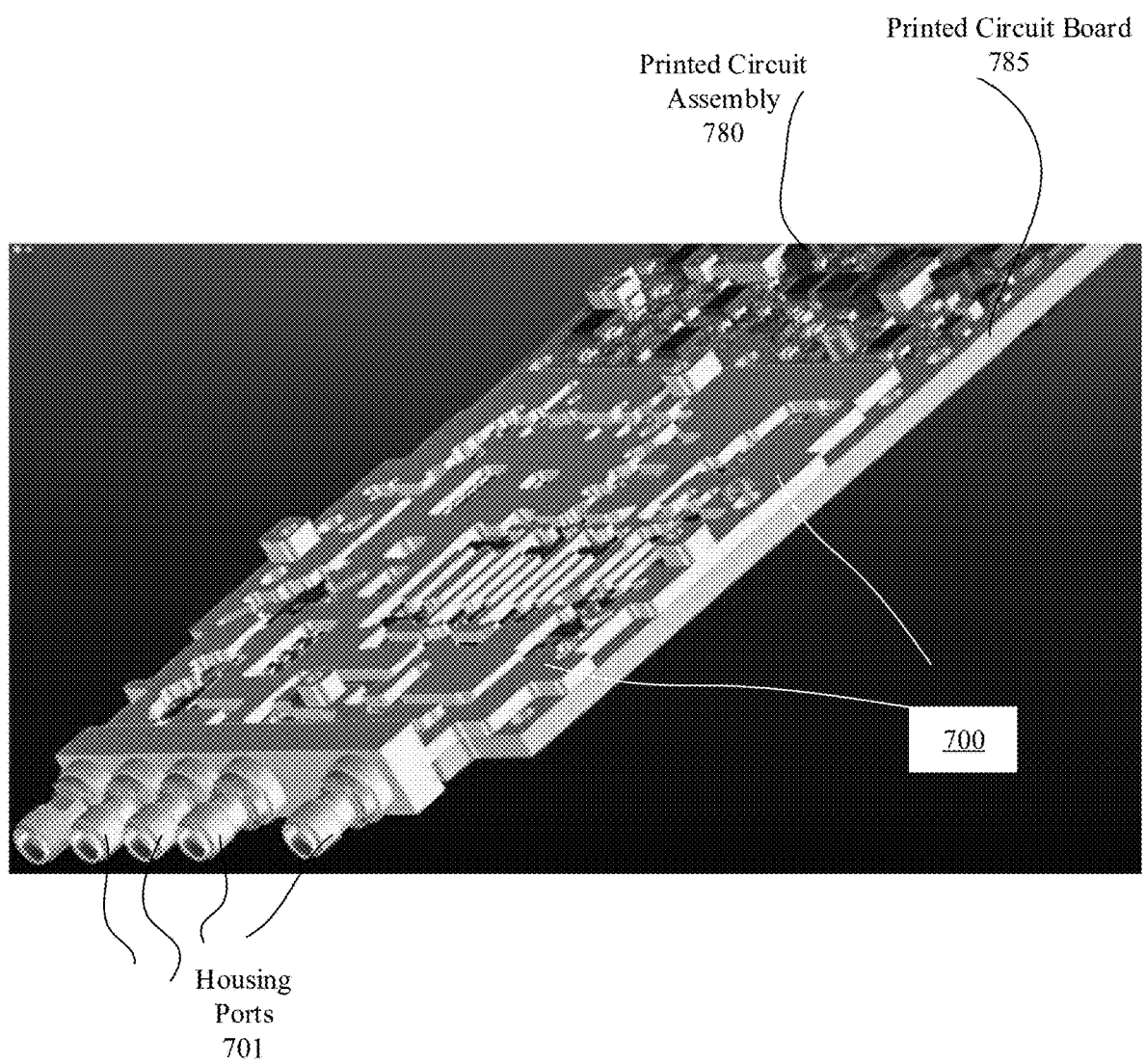
FIG. 7 illustrates the completed assembly for testing a microcircuit in FIG. 6, including a printed circuit assembly and a microcircuit housing with the lid removed, in accordance with a representative embodiment.

The printed circuit assembly 180 may be a 26-layer printed circuit board with additional circuit components installed thereon (i.e., separate from the microcircuit housing 100) as shown in parts of FIG. 6 and FIG. 7. The printed circuit assembly 180 is not limited to a 26-layer printed circuit board and may instead be a printed circuit boards with fewer or more layers. Additionally, the printed circuit assembly 180 is attached to the microcircuit housing 100 such as by screws, but the embodiment of FIG. 1D does not show the attachment points (e.g., threaded screw holes) or attachment mechanisms (e.g., screws).

The signal input 181 (Vin) and the ground lines 182a and 182b are not labelled in FIG. 1D, but the signal Vin shown in FIG. 1D is carried through the printed circuit assembly 180 by the signal input 181. The ground pin connectors 121 are connected with the ground lines 182a and 182b of the printed circuit assembly 180.

Using the microcircuit housing 100 in FIGS. 1A to 1D, the printed circuit assembly 180 may be readily removed and installed without any bonding to make electrical connections. The installation of the microcircuit housing 100 to the printed circuit assembly 180 may be made mechanically using screws. The resulting attachment may allow for earlier fault detection of problems with the printed circuit assembly by the contract manager so that the contract manager may correct the problems onsite.

Moreover, allowing the microcircuit housing 100 swappable allows for the microcircuits tested via the microcircuit housing 100 to be tested before the printed circuit assemblies arrive, ensuring that the microcircuits are functioning and providing an improved initial yield in manufacturing. That is, a damaged microcircuit housing 100 can be swapped in a service center onto a printed circuit assembly 180 that works. Similarly, if the printed circuit assembly 180 is damaged, the microcircuit housing 100 can be removed and placed into a printed circuit assembly 180 that works. This technique can be applied for both DC power, DC control, bias lines, etc., and also for radio frequency (RF) and microwave transitions into the board. As a result, a printed circuit assembly 180 is not constrained by the requirements of the microcircuit housing 100. This provides more flexibility of a printed circuit assembly 180, including dimensions of the underlying printed circuit board, stiffness and the ability to have microcircuit content on both sides of the printed circuit assembly 180.

Figure 2:
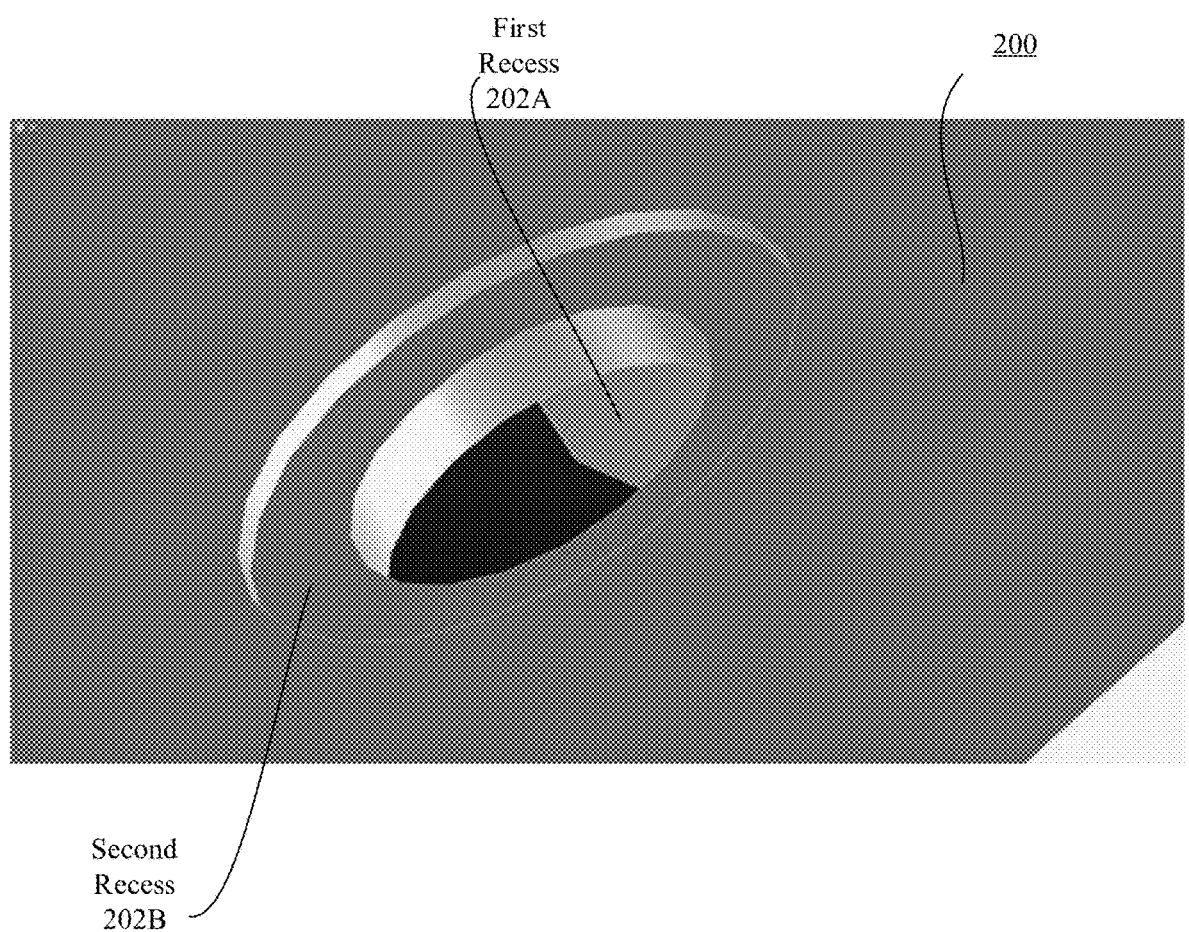
FIG. 2 illustrates a portion of an attachable and detachable microcircuit housing, in accordance with a representative embodiment.

FIG. 2 illustrates a portion of an attachable and detachable microcircuit housing, in accordance with a representative embodiment.

In FIG. 2, a microcircuit housing 200 includes a first recess 202A and a second recess 202B. The first recess 202A and the second recess 202B are examples of a transition or via through the microcircuit housing 200. The view in FIG. 2 is from the bottom of the microcircuit housing 200, without any thin film circuit yet being used to cover the bottom of the first recess 202A in the microcircuit housing 200.

As explained herein, a bonding target is placed on one side of a via through a microcircuit housing and the thermal layer 131 is placed on the other side of the via through the microcircuit housing. The thin film circuit interface 112 is placed in the via in the microcircuit housing. The dark material shown in or on a side of the via that includes the first recess 202A and the second recess 202B may be considered representative of any of the bonding target, the thermal layer or the thin film circuit interface as described herein. Additionally, as explained herein, a thin film circuit interface can be placed in the second recess to cover the first recess (e.g., to form a bottom of the first recess), and a conductive elastomer pin can be epoxied to the thin film circuit to connect with a signal line and a ground line in a printed circuit assembly.

Figure 3:
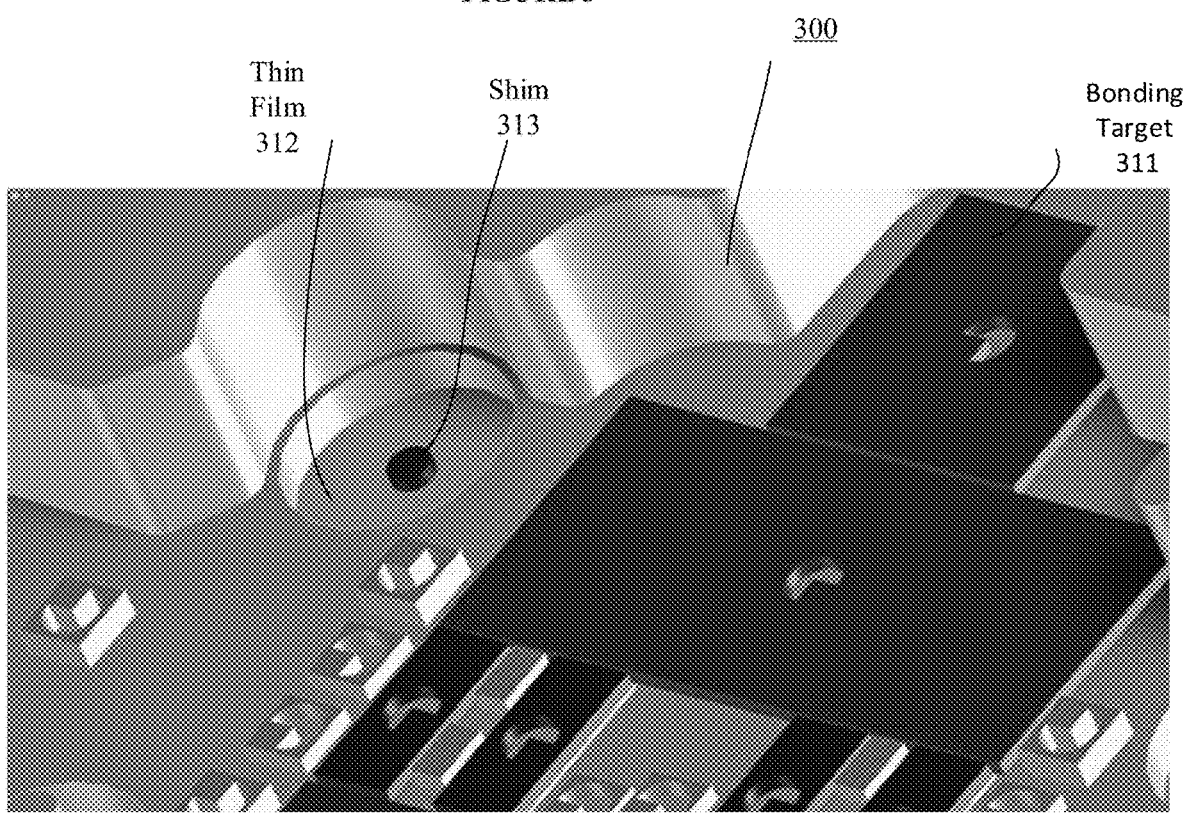
FIG. 3 illustrates a portion of another attachable and detachable microcircuit housing, in accordance with a representative embodiment.

FIG. 3 illustrates a portion of another attachable and detachable microcircuit housing, in accordance with a representative embodiment.

In FIG. 3, a thin film circuit 312 is shown in the second recess of the microcircuit housing 300 with a shim 313 attached to the thin film circuit 312 and protruding into the first recess. In other words, the view in FIG. 3 is from the top and the first recess is shown sunken into the microcircuit housing 300. The view in FIG. 3 from the top of the microcircuit housing 300 is thus contrastable with the view in FIG. 2 from the bottom of the microcircuit housing 200. A bonding target 311 is shown adjacent to the first recess on the microcircuit housing 300, so that the bonding target 311 can be connected to the shim 313, so as to form a signal path to the printed circuit assembly beneath the microcircuit housing 300.

Figure 4:
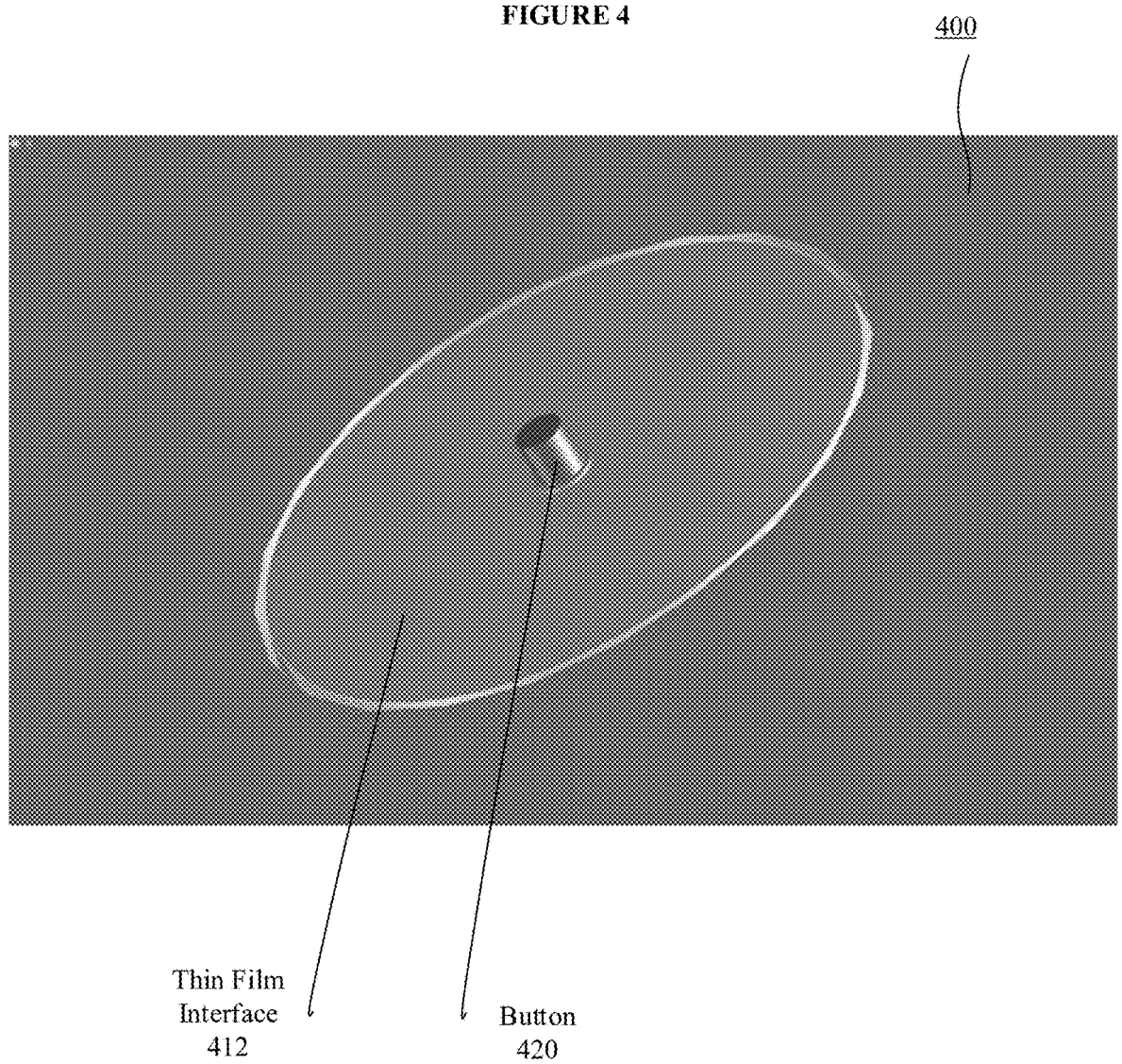
FIG. 4 illustrates the portion of the microcircuit housing in FIG. 3 with a thin film circuit interface applied in a recess, in accordance with a representative embodiment.

FIG. 4 illustrates the portion of the microcircuit housing in FIG. 3 with a thin film circuit interface applied in a recess, in accordance with a representative embodiment.

In FIG. 4, a thin film circuit interface 412 is shown filling the second recess of the microcircuit housing 400 with a conducive elastomer pin 420 (e.g., a RDIS Invisipin) on one side. In FIG. 4, the view may be as the thin film circuit interface 412 is first being pushed into the second recess of the microcircuit housing 400 with the conductive elastomer pin 420 epoxied or otherwise attached thereon. The thin film circuit interface 412 is subsequently pushed through the second recess to cover the bottom of the first recess of the microcircuit housing 400.

Figure 5:
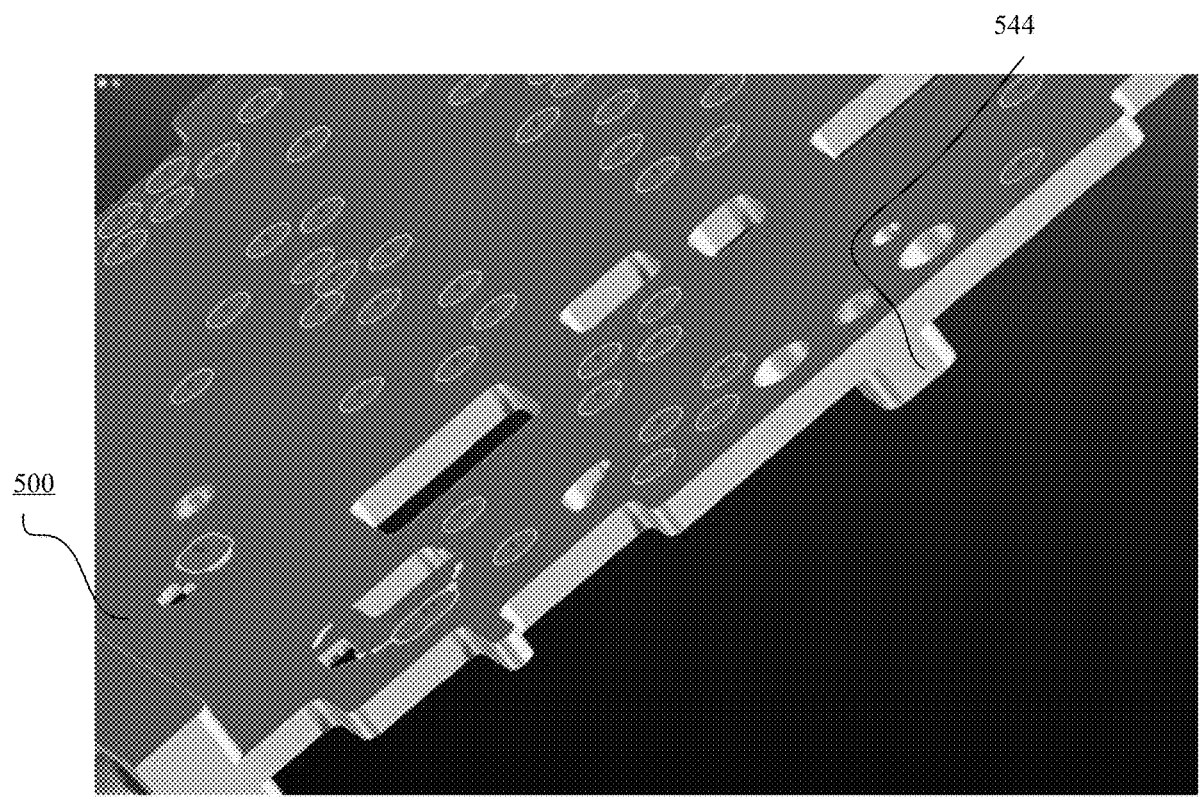
FIG. 5 illustrates an attachable and detachable microcircuit housing, in accordance with a representative embodiment.

FIG. 5 illustrates an attachable and detachable microcircuit housing, in accordance with a representative embodiment.

In FIG. 5, a microcircuit housing 500 is shown with a screw hole 544 and numerous of the vias described herein for other Figures. The view in FIG. 5 is from the bottom of the microcircuit housing 500, though the second recesses of most such vias are outlined but not yet opened. As explained throughout this disclosure, the microcircuit housing 500 may be a customized piece of equipment used for high-performance testing of devices and components that are not necessarily connected or connectable directly to a printed circuit board. In other words, the microcircuit housing 500 may be a specialized unique item of equipment customized for one user to perform testing, such as for high frequency equipment that operates at frequencies beyond 50 GHZ and even up to and beyond 100 GHz.

FIG. 6 illustrates a completed assembly for testing a microcircuit including a printed circuit assembly, a microcircuit housing, and a lid, in accordance with a representative embodiment.

In FIG. 6, screws 642 are shown connecting a lid 650 on one side of a microcircuit housing 600 to a printed circuit assembly 680 on another side of the microcircuit housing 600. The printed circuit assembly 680 includes a printed circuit board 685 with multiple circuits and/or components installed thereon separate from the microcircuit housing 600. In the embodiment of FIG. 6, the printed circuit board 685 may be or include copper. As an alternative to screws 642, bolts or nails can be used.

FIG. 7 illustrates the completed assembly for testing a microcircuit in FIG. 6, including a printed circuit assembly and a microcircuit housing with the lid removed, in accordance with a representative embodiment.

In FIG. 7, a microcircuit housing 700 is shown attached to a printed circuit assembly 780 without a lid. Housing ports 701 on the microcircuit housing 700 may be used for testing communication capabilities of a microcircuit installed on or with the microcircuit housing 700. The printed circuit assembly 780 includes a printed circuit board 785 and numerous other circuits and/or components installed therein separate from the microcircuit housing 700.

As shown, the microcircuit housing 700 has screw threads on the sides but is not necessarily uniform or symmetrical. Numerous of the recesses described herein with respect to other embodiments are shown on the microcircuit housing 700.

Figure 8:
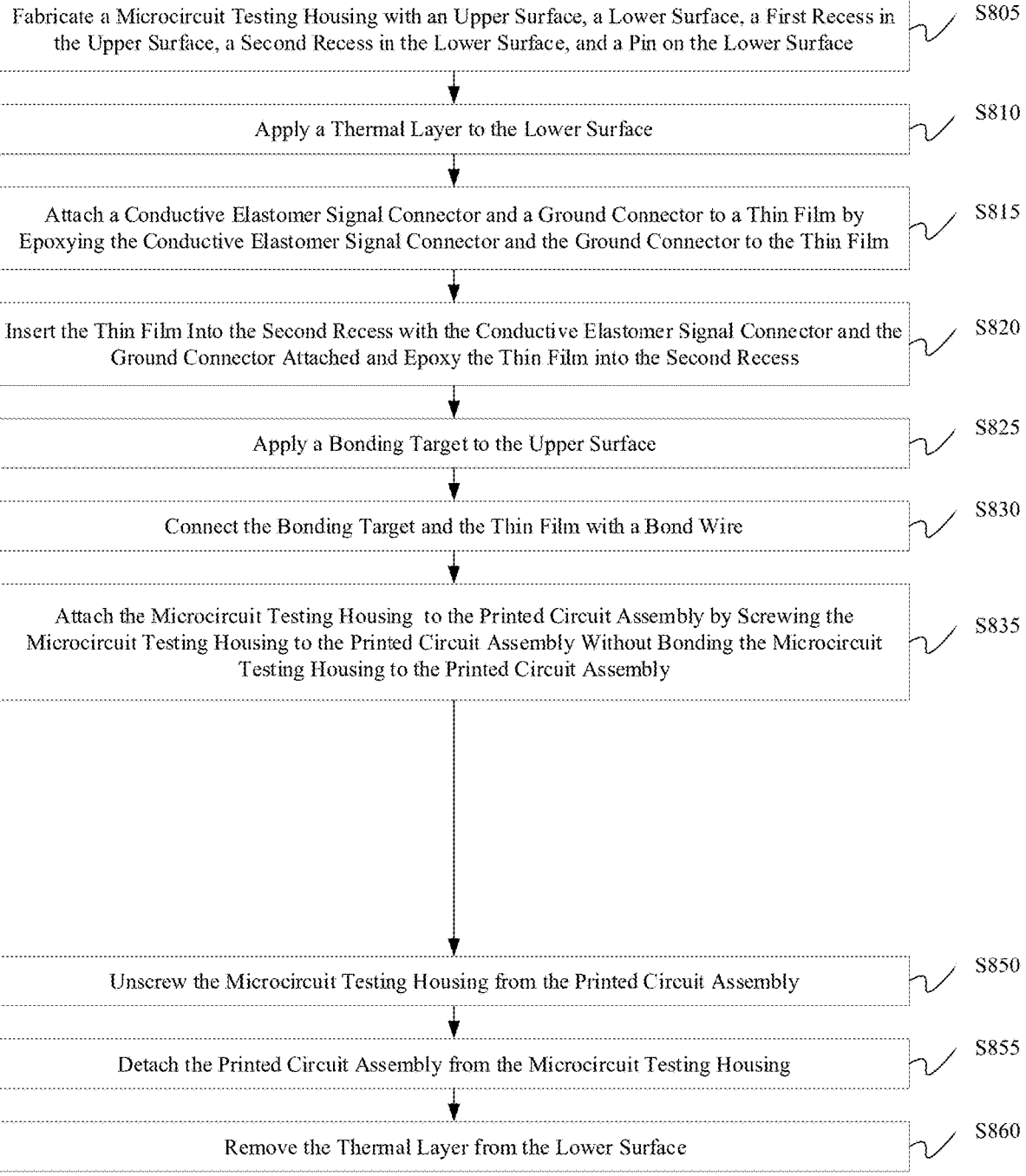
FIG. 8 illustrates a method for constructing a testing assembly for testing a microcircuit, in accordance with a representative embodiment.

FIG. 8 illustrates a method for constructing a testing assembly for testing a microcircuit, in accordance with a representative embodiment.

The process in FIG. 8 starts at block S805 by fabricating a microcircuit housing with an upper surface, a lower surface, a first recess in the upper surface, a second recess in the lower surface, and a pin on the lower surface.

At block S810, the process in FIG. 8 includes applying a thermal layer to the lower surface.

At block S815, the process in FIG. 8 includes attaching a conductive elastomer signal pin connector and a ground pin connector to a thin film circuit by epoxying the conductive elastomer signal pin connector and the ground pin connector to the thin film. Epoxy is a material such as an adhesive from a class of synthetic thermosetting polymers containing epoxide groups. Epoxying may involve gluing the conductive elastomer signal pin connector and the ground pin connector to the thin film circuit using an epoxy material such as an epoxy resin.

At block S820, the process in FIG. 8 includes inserting the thin film circuit into the second recess with the conductive elastomer signal pin connector and the ground pin connector attached and epoxying the thin film circuit into the second recess.

At block S825, the process in FIG. 8 includes applying a bonding target to the upper surface.

At block S830, the process in FIG. 8 includes connecting the bonding target and the thin film circuit with a bond wire. A bond wire is used in wire bonding to interconnect an integrated circuit and its package. At S830, the bonding target may be a microcircuit that is being connected to the microcircuit housing, where the microcircuit is the subject of the testing using the microcircuit housing and the printed circuit assembly.

At block S835, the process in FIG. 8 includes attaching the microcircuit housing to the printed circuit assembly by screwing the microcircuit housing to the printed circuit assembly without bonding the microcircuit housing to the printed circuit assembly. As a result of the attaching in FIG. 8, a microcircuit housing is detachably attached to a printed circuit assembly. Insofar as the microcircuit housing may be a precision machine and the printed circuit assembly may have thousands of components separately installed therein, the detachable attachment completed as S835 allow troubleshooting of individual components by separating the microcircuit housing and the printed circle assembly. The microcircuit housing may be an accessorized hybrid used for specialized functionality, such as a RADAR with amplifiers and mixers and high-performance instrumentation that would not necessarily be suitable for direct attachment to the printed circuit assembly.

At block S850, the process in FIG. 8 includes unscrewing the microcircuit housing from the printed circuit assembly.

At block S855, the process in FIG. 8 includes detaching the printed circuit assembly from the microcircuit housing.

At block S860, the process in FIG. 8 includes removing the thermal layer from the lower surface. The thermal layer may be removed, for example, by unpeeling the thermal layer from the lower surface.

In the process of FIG. 8, the microcircuit housing is both attached and detached from the printed circuit assembly. As should be evident, even when the microcircuit housing is not detached from the printed circuit assembly during testing, the ability to detach the microcircuit housing itself can save the cost or one or the other if either is damaged. Similarly, the ability to troubleshoot the microcircuit or the components on the printed circuit assembly separate from the microcircuit is provided by the ability to detach the microcircuit housing from the printed circuit assembly.

Additionally, the order of steps in FIG. 8 is not strictly required for some embodiments. For example, the order of S820 and S825 may be reversed.

Although bond-free interconnect between a microcircuit housing and a printed circuit assembly has been described with reference to several exemplary embodiments, it is understood that the words that have been used are words of description and illustration, rather than words of limitation. Changes may be made within the purview of the appended claims, as presently stated and as amended, without departing from the scope and spirit of bond-free interconnect between a microcircuit housing and a printed circuit assembly in its aspects. Although bond-free interconnect between a microcircuit housing and a printed circuit assembly has been described with reference to particular means, materials and embodiments, bond-free interconnect between a microcircuit housing and a printed circuit assembly is not intended to be limited to the particulars disclosed; rather bond-free interconnect between a microcircuit housing and a printed circuit assembly extends to all functionally equivalent structures, methods, and uses such as are within the scope of the appended claims.

For example, the microcircuit housing 100 shown in FIG. 1 is shown with a single via that includes the first recess 102A and the second recess 102B. However, the microcircuit housing 100 may provide numerous vias for numerous different bonding targets analogous to the bonding target 111. That is, the microcircuit housing 100 may be a specialized unique item of equipment with multiple particular microcircuits implemented or implementable simultaneously thereon. The microcircuits on a microcircuit housing 100 may be housed in or on the microcircuit housing 100 for high-performance testing, or simply to protect the microcircuits during testing from directly contacting the printed circuit assembly 180. This may allow for improved diagnosis of problems in either the microcircuit housing or the printed circuit assembly.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. A microcircuit housing configured to attach to and detach from a printed circuit board, comprising:
an upper surface configured to support a bonding target;

a lower surface opposite the upper surface and configured to support a thermal layer between the microcircuit housing and the printed circuit board;

a first recess in or around which a thin film circuit via, a thin film circuit, and a microcircuit exist, wherein the microcircuit is connected to the bonding target by a bond wire;

a second recess configured to house a conductive elastomer signal pin connector to connect the microcircuit to the printed circuit board and a ground pin connector to connect the microcircuit to the printed circuit board; and a pin on the lower surface configured to stop the microcircuit housing from approaching the printed circuit board.

2. The microcircuit housing of claim 1, wherein the first recess is adjacent to the second recess, the first recess provides an opening in the upper surface and the second recess provides an opening in the lower surface, and wherein the first recess has a first center and a maximum diameter, the second recess has a second center and a maximum diameter, and the maximum diameter of the first recess is less than the maximum diameter of the second recess.

3. The microcircuit housing of claim 1, wherein the conductive elastomer signal pin connector connects the microcircuit to a signal line of the printed circuit board, and the ground pin connector connects the microcircuit to a ground line of the printed circuit board.

4. The microcircuit housing of claim 1, wherein: the conductive elastomer signal pin connector and the ground pin connector; and the conductive elastomer signal pin connector and the ground pin connector are fastened to the thin film circuit, and the thin film circuit is fastened into the second recess.

5. The microcircuit housing of claim 1, wherein the thermal layer comprises conductive silicone rubber placed between the microcircuit housing and the printed circuit board.

6. The microcircuit housing of claim 1, wherein the thermal layer comprises a thermal paste pasted onto the lower surface.

7. The microcircuit housing of claim 1, wherein the thermal layer comprises a gasket.

8. The microcircuit housing of claim 1, wherein the printed circuit board is configured to attach to and detach from the microcircuit housing by screws without bonding the printed circuit board to the microcircuit housing.

9. A microcircuit housing configured to attach to and detach from a printed circuit board, comprising:

an upper surface configured to support a bonding target;

a lower surface opposite the upper surface and configured to support a thermal layer between the microcircuit housing and the printed circuit board;

a recess in or around which a thin film circuit via, a thin film circuit, and a microcircuit exist, wherein the microcircuit is connected to the bonding target by a bond wire, and a conductive elastomer signal pin connector to connect the bonding target to the printed circuit board and a ground pin connector to connect the bonding target to the printed circuit board; and a pin on the lower surface configured to stop the microcircuit housing from approaching the printed circuit board, wherein the conductive elastomer signal pin connector connects the bonding target to a signal line of the printed circuit board, and the ground pin connector connects the bonding target to a ground line of the printed circuit board.

10. The microcircuit housing of claim 9, further comprising:

the conductive elastomer signal pin connector and the ground pin connector, wherein the conductive elastomer signal pin connector and the ground pin connector are fastened to the thin film circuit.

11. The microcircuit housing of claim 10, wherein the conductive elastomer signal pin connector connects the microcircuit to a signal line of the printed circuit board, and the ground pin connector connects the microcircuit to a ground line of the printed circuit board.

12. The microcircuit housing of claim 10, wherein: the conductive elastomer signal pin connector and the ground pin connector; and the conductive elastomer signal pin connector and the ground pin connector are fastened to the thin film circuit, and the thin film circuit is fastened into the recess.

13. The microcircuit housing of claim 9, wherein the thermal layer comprises conductive silicone rubber placed between the microcircuit housing and the printed circuit board.

14. The microcircuit housing of claim 9, wherein the thermal layer comprises a thermal paste pasted onto the lower surface.

15. The microcircuit housing of claim 9, wherein the thermal layer comprises a gasket.

16. The microcircuit housing of claim 9, wherein the printed circuit board is configured to attach to and detach from the microcircuit housing by screws without bonding the printed circuit board to the microcircuit housing.

17. The microcircuit housing of claim 9, wherein the thermal layer comprises conductive silicone rubber placed between the microcircuit housing and the printed circuit board.

* * * * *